(12) United States Patent
Hiramoto et al.

(10) Patent No.: US 9,796,925 B2
(45) Date of Patent: Oct. 24, 2017

(54) METHOD FOR REMOVING TARGET OBJECT

(71) Applicant: CANON KABUSHIKI KAISHA, Tokyo (JP)

(72) Inventors: Atsushi Hiramoto, Machida (JP); Atsunori Terasaki, Kawasaki (JP); Yoshiyuki Fukumoto, Kawasaki (JP); Ryoji Kanri, Zushi (JP); Masahiko Kubota, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/258,920

(22) Filed: Sep. 7, 2016

(65) Prior Publication Data

US 2017/0073579 A1 Mar. 16, 2017

(30) Foreign Application Priority Data

Sep. 10, 2015 (JP) .................................. 2015-178591

(51) Int. Cl.
*B41J 2/16* (2006.01)
*C09K 13/00* (2006.01)

(52) U.S. Cl.
CPC .............. *C09K 13/00* (2013.01); *B41J 2/162* (2013.01); *B41J 2/1628* (2013.01)

(58) Field of Classification Search
None
See application file for complete search history.

(56) References Cited

U.S. PATENT DOCUMENTS

| 5,648,324 A * | 7/1997 | Honda ................. C11D 7/5009 134/38 |
| 7,396,773 B1 * | 7/2008 | Blosse .................. C11D 7/261 257/E21.252 |
| 7,837,887 B2 | 11/2010 | McReynolds |
| 2003/0100459 A1 * | 5/2003 | Yoon ...................... G03F 7/425 510/175 |
| 2004/0147421 A1 * | 7/2004 | Charm ................. C11D 7/3218 510/176 |
| 2005/0101500 A1 * | 5/2005 | Baik ....................... G03F 7/425 510/175 |
| 2011/0076852 A1 * | 3/2011 | Takahashi ................ C11D 7/08 438/710 |

* cited by examiner

*Primary Examiner* — Shamim Ahmed
(74) *Attorney, Agent, or Firm* — Canon U.S.A. Inc., IP Division (57) ABSTRACT

There is provided a method for selectively removing a plurality of target objects by using a stripping solution without causing damage to an underlying material, the target objects including a resist used as a mask material for dry etching and a transformed layer and a deposited film formed during the dry etching, the stripping solution including a first composition, a second composition, and a third composition, and the method including continuously changing the composition of the stripping solution from the first composition to the second composition and then from the second composition to the third composition.

20 Claims, 5 Drawing Sheets

○ : HYDROXYLAMINE
■ : AMINOETHANOL

FIG. 7

○ : HYDROXYLAMINE
■ : AMINOETHANOL

METHOD FOR REMOVING TARGET OBJECT

BACKGROUND OF THE INVENTION

Field of the Invention

Embodiments of the present invention relate to a method for selectively removing a plurality of target objects after dry etching by continuously changing the composition of a stripping solution.

Description of the Related Art

In the processing of common microelectromechanical systems (MEMS) and the processing of a semiconductor device, there are a large number of examples in which a silicon substrate is processed so as to be penetrated and in which a structure having depth comparable to the thickness of the silicon substrate is processed. Such a technique for microfabricating a semiconductor device is employed for the processing of a silicon substrate used for a liquid ejection head.

As a liquid ejection head used for a liquid ejection apparatus, such as an ink jet printer, a structure including a flow passage-forming member arranged on a silicon substrate is known. The flow passage-forming member includes an ejection orifice that ejects a droplet and a liquid flow passage communicating with the ejection orifice. Typically, a plurality of liquid flow passages are arrayed. A liquid ejection energy production element is arranged on the silicon substrate so as to eject a droplet from the ejection orifice by energy produced in the liquid ejection energy production element. Furthermore, a plurality of supply ports communicating with the liquid flow passages, and a common liquid chamber communicating with the supply ports are arranged on the silicon substrate.

In this structure, for example, a liquid is heated and bubbled by thermal energy from the liquid ejection energy production element, such as an ejection heater, to eject from the ejection orifices. In this case, the liquid flow passages are supplied with the liquid from the supply ports. The supply ports are supplied with the liquid from the common liquid chamber.

The supply ports and the common liquid chamber are formed by etching the silicon substrate or an insulating film of a wiring layer on a surface. Nowadays, there are growing instances where etching treatment is changed from wet etching, which has been mainly employed, to dry etching, in particular, reactive ion etching with high anisotropy in order to achieve the miniaturization and higher density of a liquid ejection head.

Typically, a resist may be used as a mask material for dry etching. In dry etching, the impact of plasma often forms a transformed layer on a surface of the resist (see FIG. 5B). The transformed layer is a layer of the resist that has been structurally changed. The transformed layer is not dissolved in a resist-stripping solution, in some cases.

Figure 5A:
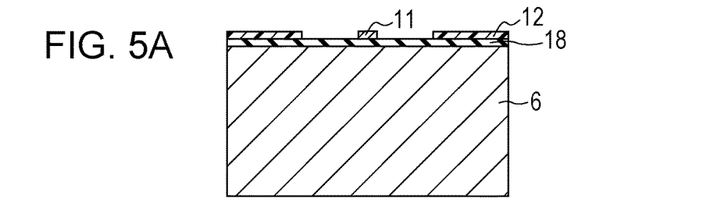
FIGS. 5A to 5E are schematic cross-sectional views illustrating examples of steps of removing a target object according to an embodiment of the present invention.
Figure 5B:
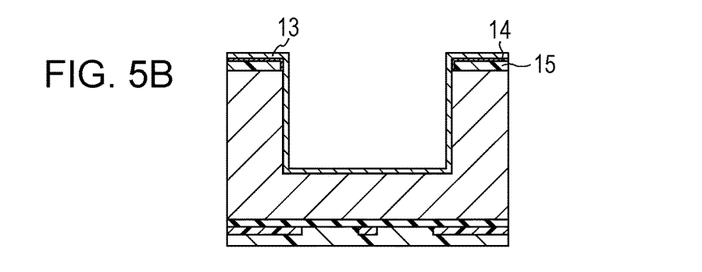

In the etching of silicon and a silicon oxide film, a deposited reaction product (hereinafter, also referred to as a "deposited film") is often formed on a resist surface and substrate surfaces (including an etched side surface) (see FIG. 5B). This is attributed to the fact that a dry etching technique for the foregoing materials is a system in which etching is performed in the vertical direction while the deposited film is formed on a side wall to protect the substrate. An example of a technique for etching silicon to form a high-aspect-ratio structure is the Bosch process in which $SF_6$ and $C_4F_8$ are alternately used. In the process, a fluorocarbon-based polymer produced from $C_4F_8$ adheres to the side wall to inhibit etching in the direction of the side wall. A $SiF_x$-based compound containing silicon that has been etched can be contained in the deposited film. In this specification, a compound formed from plasma described above and a compound formed by etching an object are collectively referred to as "reaction products". Depositions (deposited films) of these reaction products are not dissolved in a resist-stripping solution, in some cases.

As well as the resist, the transformed layer and the deposited film formed during the etching need to be removed so as not to cause damage to an underlying material. However, when the transformed layer and the deposited film are removed with a resist-stripping solution, the transformed layer and the deposited film can be left as residues after a stripping operation. U.S. Pat. No. 7,837,887 discloses a method that includes removing a mask material by ashing and removing a residue with a stripping solution (EKC, registered trademark).

SUMMARY OF THE INVENTION

One aspect of the present invention is directed to providing a method for removing a target object with a stripping solution, the target object including a mask material, a transformed layer, and a deposited film, the mask material being formed on a substrate by using a resist, the transformed layer being formed on a surface of the mask material in a step of forming a pattern on the substrate by dry etching with the mask material, the deposited film being formed on a surface of the substrate and a surface of the transformed layer, and the stripping solution including:

a first composition capable of removing the deposited film, a second composition capable of removing the transformed layer, and a third composition capable of removing the mask material, the method comprising:

a removal step including:

a substep of removing the deposited film with the stripping solution having the first composition, a substep of continuously changing the composition of the stripping solution from the first composition to the second composition at least prior to the exposure of the transformed layer, a substep of removing the transformed layer with the stripping solution having the second composition, a substep of continuously changing the composition of the stripping solution from the second composition to the third composition with at least the mask material remaining, and a substep of removing the mask material with the stripping solution having the third composition, wherein the stripping solution contains at least one of hydroxylamine and an amino alcohol, wherein the concentration of hydroxylamine in the stripping solution is not changed or is reduced as the removal step proceeds, and wherein the concentration of the amino alcohol in the stripping solution is not changed or is increased as the removal step proceeds.

Further features of the present invention will become apparent from the following description of exemplary embodiments with reference to the attached drawings.

DESCRIPTION OF THE EMBODIMENTS

In embodiments disclosed in U.S. Pat. No. 7,837,887, no underlying material is damaged by ashing. In common MEMS processing, a material, such as an organic material, having low ashing resistance is present, in some cases. EKC (registered trademark) used as a stripping solution in U.S. Pat. No. 7,837,887 is commonly effective in removing a fluorocarbon-based deposited film. However, the ability of EKC (registered trademark) to remove a transformed layer on a resist surface is not high. It is known that the use of EKC (registered trademark) forms a structure that is not easily removed, depending on a resist material.

There is a stripping solution capable of removing all three target objects: the resist, the transformed layer, and the deposited film. However, the stripping solution has a high ability to remove an organic material and often causes damage to an organic material to be left on a substrate. Thus, there has been a demand for the development of a method for sequentially removing the target objects with stripping solutions appropriate for the target objects.

Figure 1A:
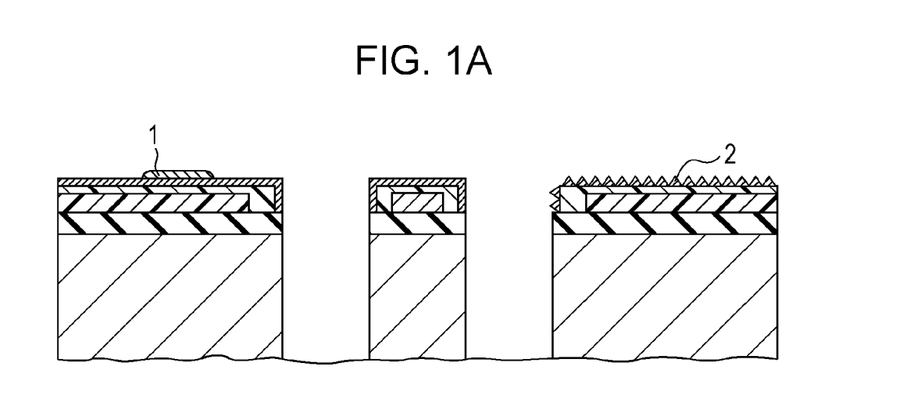
FIGS. 1A and 1B are schematic cross-sectional views illustrating a concept according to an embodiment of the present invention.
Figure 1B:
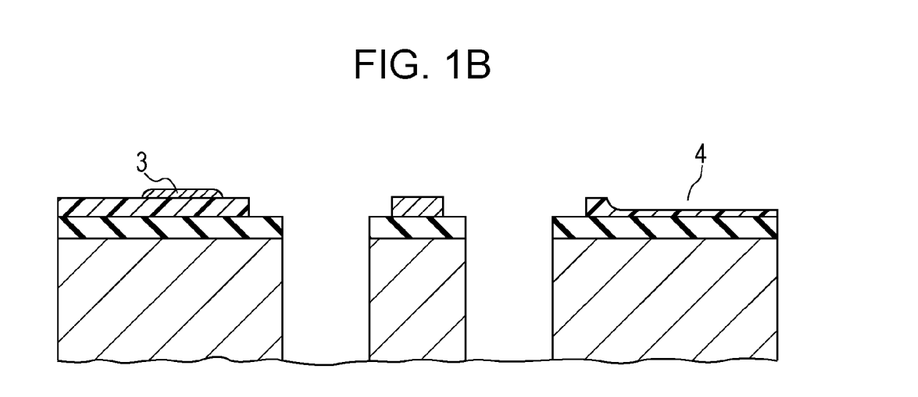

The thickness of each of the resist, the transformed layer, and the deposited film is not always constant because of the in-plane distribution, wafer-to-wafer variations in thickness, and lot-to-lot variations in thickness. It is thus difficult to accurately detect boundaries between the target objects and the underlying material. In the case where the target objects are removed with the stripping solutions appropriate for the target objects, the deposited film 1 and the resist 3 are left at portions of the target objects with low stripping rates. Furthermore, damage to the underlying material (the transformed layer 2 and the organic film 4) can be caused in portions of the target objects with high stripping rates (see FIGS. 1A and 1B).

The present invention provides a method for efficiently removing all the target objects without causing damage to the underlying material.

While embodiments of the present invention will be described below, the present invention is not limited to these embodiments.

An embodiment of the present invention is directed to providing a method for selectively removing a plurality of target objects, such as a resist used as a mask material for dry etching and a transformed layer and a deposited film that are formed during the etching, with a stripping solution having a first composition, a second composition, or a third composition without causing damage to an underlying material. In an embodiment of the present invention, the stripping solution having the first composition is first prepared. The composition of the stripping solution having the first composition is continuously changed to prepare the stripping solution having the second composition. The composition of the stripping solution having the second composition is continuously changed to prepare the stripping solution having the third composition. That is, the stripping solution having the first composition is defined as a stripping solution having a composition ranging from a composition at the time when the stripping solution having the first composition is prepared to a composition at the time when the stripping solution having the second composition is prepared. The stripping solution having the second composition is defined as a stripping solution having a composition ranging from the composition at the time when the stripping solution having the second composition is prepared to a composition at the time when the stripping solution having the third composition is prepared. The stripping solution having the third composition is defined as a stripping solution having a composition ranging from the composition at the time when the stripping solution having the third composition is prepared to a composition after the stripping solution having the third composition is prepared. Regarding the initial concentration of the stripping solution in this specification, in the case of the stripping solution having the first composition, concentrations of components in the composition at the time when the stripping solution having the first composition is prepared are defined as the initial concentrations of the components. In the case of the stripping solution having the second composition, concentrations of components in the composition at the time when the stripping solution having the second composition is prepared from the stripping solution having the first composition are defined as the initial concentrations of the components. In the case of the stripping solution having the third composition, concentrations of components in the composition at the time when the stripping solution having the third composition is prepared from the stripping solution having the second composition are defined as the initial concentrations of the components.

Each of the stripping solution having the first composition, the stripping solution having the second composition, and the stripping solution having the third composition contains at least one of hydroxylamine and an amino alcohol. The amino alcohol indicates an aliphatic compound containing a primary amino group in its molecule and a hydroxy group in its molecule. Specific examples of the amino alcohol include aminoethanol, aminopropanol, aminoisopropanol, aminobutanol, aminopentanol, and aminohexanol. Of these, aminoethanol having low molecular weight can be used because of its permeability to the target objects.

In an embodiment of the present invention, a substrate is subjected to dry etching with a resist pattern serving as a mask material. The resist used as the mask material is not particularly limited. Known resist materials may be used. Among these materials, a resist mainly containing at least one resin selected from novolac-based resins, styrene-based resins (for example, polyhydroxystyrene-based resins), and acrylic-based resins can be used because of its high resistance to dry etching. Table 1 lists typical resists used in embodiments of the present invention and compositions of the resists. Among these resists, in particular, an example of a resist that easily produces a transformed layer by bringing the resist into contact with hydroxylamine is TZNR (registered trademark)-E1050 PM (manufactured by Tokyo Ohka Kogyo Co., Ltd). Reactive ion etching can be employed as dry etching. Stripping solution having the first composition The stripping solution having the first composition is a stripping solution to remove a deposited reaction product (deposited film). The reaction product mainly contains a fluorocarbon-based polymer and a $SiF_x$-based compound containing silicon. To remove the deposited film, swell peeling may be employed. The swell peeling refers to a technique in which when the reaction product comes into contact with a chemical solution (stripping solution) and thus swells to generate stresses, the reaction product is peeled from a substrate or an underlying material by the stresses. A stripping solution having a dissolution effect of dissolving the reaction product in addition to a swelling effect can be used. A hydroxylamine-containing stripping solution has both of the swelling effect and the dissolution effect and thus can be used as the stripping solution having the first composition. A higher hydroxylamine content results in increases in peeling and dissolution effects on the reaction product.

Hydroxylamine is a component that also serves as a resist-stripping solution. However, as will be described below, a phenomenon in which some resists are transformed by contact with a stripping solution and thus cannot be removed is known. The inventors have mixed a stripping solution mainly containing hydroxylamine with an amino alcohol, which is commonly used for a resist-stripping solution, and have found experimentally that resists are dissolved in the resulting mixture without causing the transformation of resists. This provides stripping solutions having the ability to remove various resists. The addition of the amino alcohol does not cause a loss of the removability of the reaction product. Thus, the stripping solution containing hydroxylamine and the amino alcohol may be used as the stripping solution having the first composition.

The stripping solution having the first composition is capable of removing the deposited film and can have an initial concentration of hydroxylamine of 2.5% by mass or more. The hydroxylamine concentration in the stripping solution is controlled so as not to be changed or so as to be reduced when the composition of the stripping solution is changed from the first composition to the second composition. The stripping solution having the first composition may or may not contain the amino alcohol. The amino alcohol concentration in the stripping solution having the first composition is controlled so as not to be changed or so as to be increased when the composition of the stripping solution is changed from the first composition to the second composition. After removal of the deposited film with the stripping solution having the first composition, the composition of the stripping solution having the first composition is continuously changed to the second composition at least prior to the exposure of a transformed layer. To increase the amino alcohol concentration in the stripping solution having the first composition, for example, a stripping solution containing the amino alcohol may be added. An operation in which the stripping solution having the first composition is partially removed may be performed, as needed.

Stripping Solution Having the Second Composition

The stripping solution having the second composition is a stripping solution to remove the transformed layer of the resist. The transformed layer is formed by the impact of high-energy ions and radicals produced by plasma during dry etching on the resist to cause complex chemical reactions on a resist surface. The transformed layer has a different structure from that of the resist and thus is not easily removed with a common resist-stripping solution. The inventors have found experimentally that the use of a stripping solution containing hydroxylamine and the amino alcohol enables the transformed layer to be removed. That is, the stripping solution having the second composition can contain both of hydroxylamine and the amino alcohol. It has been demonstrated that the stripping solution has very high solvent power and dissolves various organic materials. For example, the stripping solution is known to cause damage to a polyether amide, which is not dissolved in a typical resist-stripping solution. The polyether amide can be used as a component used to form a liquid ejection head. Thus, when the stripping solution having the second composition and containing hydroxylamine and the amino alcohol is used, the composition is important.

The stripping solution having the second composition is capable of removing the transformed layer and can have an initial concentration of hydroxylamine of 2.5% by mass or more and an initial concentration of the amino alcohol of 7.5% by mass or more. It has been demonstrated experimentally that when the stripping solution having a composition within the foregoing range is used, the transformed layer is more efficiently removed by dissolution. It has been found that the stripping solution having a composition within the foregoing range is also effective in removing the deposited film. After removal of the transformed layer with the stripping solution having the second composition, the composition of the stripping solution is continuously changed from the second composition to the third composition with at least the resist remaining (prior to the exposure of the substrate or underlying material). When the composition of the stripping solution is changed from the second composition to the third composition, the hydroxylamine concentration in the stripping solution is controlled so as not to be changed or so as to be reduced, and the amino alcohol concentration in the stripping solution is controlled so as not to be changed or so as to be increased. To increase the amino alcohol concentration, for example, a stripping solution containing the amino alcohol may be added. An operation in which the stripping solution having the second composition is partially removed may be performed, as needed.

Stripping Solution Having Third Composition

The stripping solution having the third composition is a stripping solution (resist-stripping solution) to remove the resist used as the mask material. The resist-stripping solution can have a composition which removes only the target resist by dissolution and which does not cause damage to an underlying metal, organic film, or inorganic film. An example of the stripping solution having the third composition is a stripping solution mainly containing the amino alcohol. The underlying material refers to a layer containing an organic material (for example, a polyether amide-based resin) other than the target objects, the layer being arranged on an upper surface of the substrate and a lower surface of the mask material.

The stripping solution having the third composition is capable of removing the mask material (resist) and can have an initial concentration of the amino alcohol of 10% by mass or more. The stripping solution having the third composition can have a hydroxylamine concentration less than 0.5% by mass and an amino alcohol concentration of 10% by mass or more prior to the exposure of the underlying material in order not to cause damage to an organic material, such as a polyether amide-based resin, contained in the underlying material. It has been demonstrated experimentally that the stripping solution having the foregoing composition enables the resist to be selectively removed and does not cause damage to the organic material present in the underlying material.

In an embodiment of the present invention, the stripping solution having the first composition appropriate for the removal of the deposited film, the stripping solution having the second composition appropriate for the removal of the transformed layer, and the stripping solution having the third composition appropriate for the removal of the resist are used to selectively remove the plural target objects. An embodiment of the present invention is characterized in that the composition of the stripping solution is continuously changed from the first composition appropriate for the removal of the deposited film to the second composition appropriate for the removal of the transformed layer and then from the second composition to the third composition appropriate for the removal of the resist at least prior to the exposure of lower layers of the target objects. As described above, the composition of the stripping solution starts to change prior to the exposure of the lower layers of the target objects, thereby inhibiting damage to the lower layers or transformation due to the stripping solution. Furthermore, all the target objects are removed without any residue regardless of the thickness distribution of each target object. For example, the lower layers of the deposited film indicate the transformed layer, the resist, and so forth. The lower layers of the transformed layer indicate the resist, the underlying material, and so forth. The lower layers of the resist indicate the underlying material and so forth.

In an embodiment of the present invention, a processing method with an apparatus for removing a target object is not limited. For example, single-wafer processing and batch processing may be employed. The single-wafer processing is a method in which a single wafer is processed at a time. The batch processing is a method in which substrates are immersed in a liquid bath to bring the substrates into contact with a stripping solution in the liquid bath. These processing methods may be appropriately employed, depending on the purpose.

An example of the single-wafer processing is a method in which an apparatus equipped with a cup that can spin is used, a stripping solution is charged into the cup, and a wafer is completely immersed while spinning. Hereinafter, in the single-wafer processing, the cup that can spin is referred to as a "cup for single-wafer processing" or "cup". A step of charging the stripping solution into the cup is referred to as "solution pooling".

Figure 3:
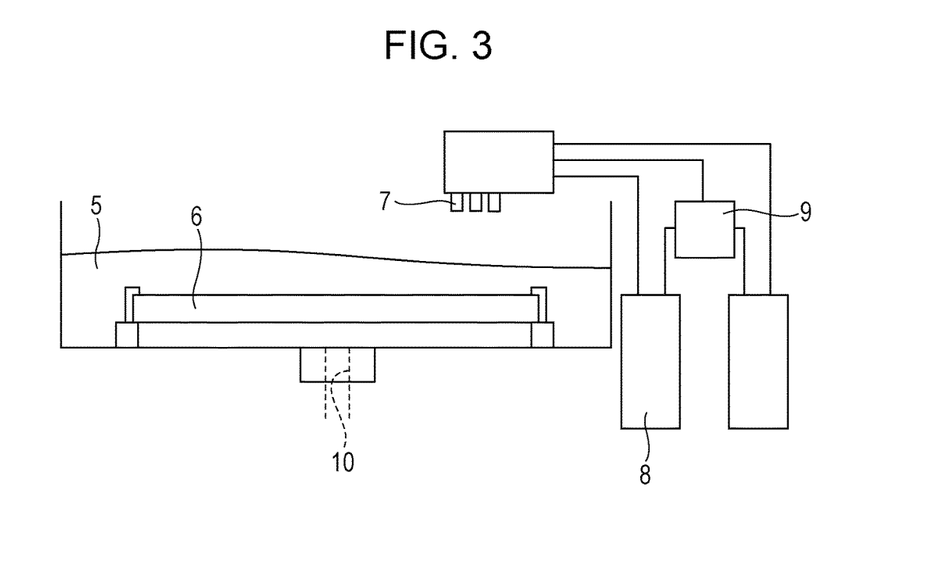
FIG. 3 is a schematic diagram of a removal apparatus according to an embodiment of the present invention.

FIG. 3 illustrates the outline of a removal apparatus equipped with a cup for single-wafer processing. A substrate 6 is spun. A stripping solution 5 is pooled in the cup by, for example, discharging, spraying, flowing, or dropping of the stripping solution 5 from ejection nozzles 7 so as to cover a surface of the substrate 6, thereby bringing the surface of the substrate 6 into contact with the stripping solution 5. The stripping solution 5 may be dropped with the substrate 6 spinning, as needed. To improve stripping performance, an ultrasonic nozzle can be used for the ejection of the stripping solution 5. To enhance the controllability of a change in the composition of the stripping solution 5, the cup can be equipped with a drainage nozzle 10 serving as a liquid drainage mechanism of draining the stripping solution 5 in the cup. The removal apparatus includes a stripping solution mixing tank 9 that mixes different types of stripping solutions fed from stripping solution feed tanks 8. The composition of the stripping solution 5 may be changed prior to the application of the stripping solution 5 ejected from the ejection nozzles 7. This may be combined with a change in composition in the cup. The temperature of the stripping solution 5, the amount of the stripping solution 5 ejected, and the number of spin rotations of the substrate 6 may be appropriately set, depending on the target substrate and the target object.

A temperature at which a stripping process is performed is not particularly limited and is preferably 35° C. or higher and more preferably 40° C. or higher because the reactivity of hydroxylamine in the stripping solution increases with increasing temperature. In the case of the single-wafer processing, the temperature refers to the temperature of the stripping solution ejected from the nozzles. In the case of the batch processing, the temperature refers to the temperature of the stripping solution in a liquid bath.

In the case of the single-wafer processing, the feed rate of the stripping solution added to the cup can be 10 cc/min or more from the viewpoint of achieving good in-plane uniformity and stable processing performance during continuous processing. When the substrate is spun, the substrate can be spun at 5 to 1000 rpm from the same viewpoint as above. These values are appropriately selected also in consideration of, for example, the size of the substrate.

First Embodiment

An example of a first embodiment of the present invention is a method for sequentially removing target objects by adding a stripping solution containing an amino alcohol to a stripping solution containing hydroxylamine to continuously change the composition of the resulting stripping solution. In this embodiment, the stripping solution having the first composition preferably has an initial concentration of hydroxylamine of 2.5% by mass or more and an initial concentration of the amino alcohol less than 7.5% by mass. The initial concentration of hydroxylamine is more preferably 5% by mass or more. In this embodiment, the stripping solution having the first composition can have a larger initial concentration of hydroxylamine than the initial concentration of the amino alcohol. As the stripping solution having the first composition, for example, a stripping solution can have an initial concentration of hydroxylamine of 5% by mass or more and an initial concentration of the amino alcohol of 0% by mass.

In this embodiment, the deposited film is removed with the stripping solution having the first composition that has a high hydroxylamine content. Thus, the removal of the deposited film is performed at a very high level. Next, the amino alcohol is continuously added to the stripping solution so as to reduce the hydroxylamine concentration and increase the amino alcohol concentration. Thus, the composition of the stripping solution is continuously changed from the first composition to the second composition and then from the second composition to the third composition, thereby removing the transformed layer and the resist. In this embodiment, each of the plural target objects is removed with the stripping solution having a composition nearly optimal for the removal of the corresponding target object. Thus, at interfaces between the target objects, intended target objects are selectively removed without causing damage to a layer containing another target object or the underlying material.

Figure 2A:
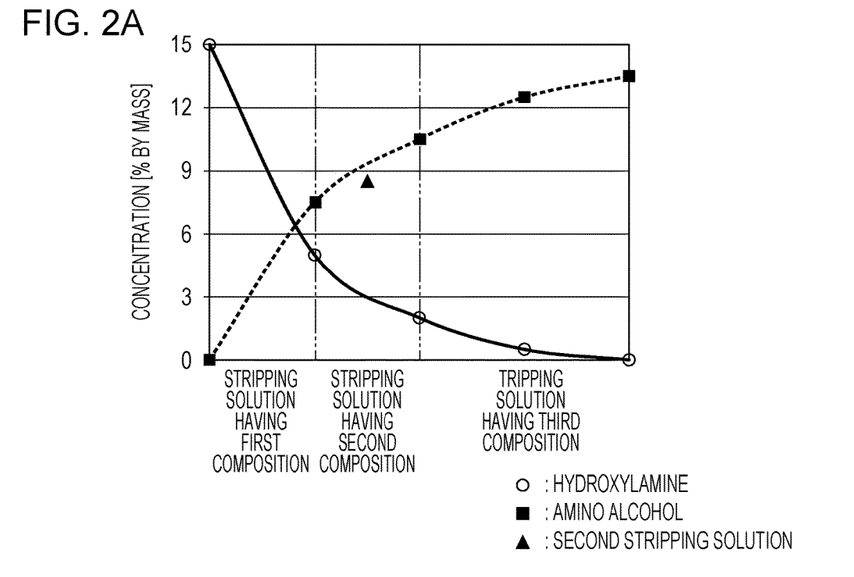
FIGS. 2A and 2B are graphs each depicting an example of a change in the concentration of a stripping solution according to a first embodiment of the present invention.
Figure 2B:
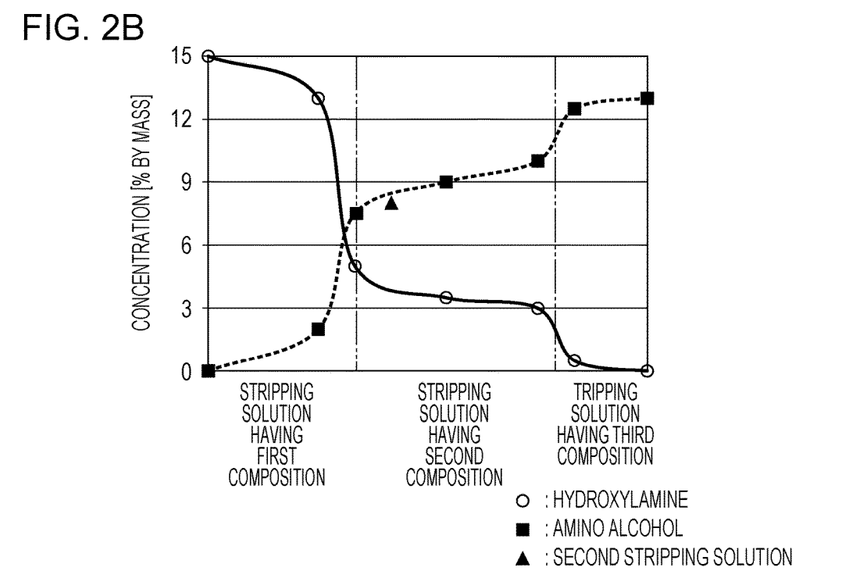

As described above, the composition of the stripping solution is continuously changed from the first composition to the second composition and then from the second composition to the third composition, thereby providing the advantageous effects of an embodiment of the present invention. As examples of this embodiment, FIGS. 2A and 2B each illustrate a change in the composition of the stripping solution having the first composition, the stripping solution having an initial concentration of hydroxylamine of 15% by mass and an initial concentration of the amino alcohol of 0% by mass. FIGS. 2A and 2B each illustrate an example of the change in the composition of the stripping solution. For example, as indicated by a solid triangle in FIG. 2A, the stripping solution having the second composition may be prepared so as to have a hydroxylamine concentration of 8.5% by mass and an amino alcohol concentration of 8.5% by mass. The composition of the stripping solution having the second composition is exemplified by the solid triangle. The amino alcohol may be added at a constant feed rate as illustrated in FIG. 2A. Alternatively, the amino alcohol may be added while the feed rate is appropriately adjusted as illustrated in FIG. 2B. In the case as illustrated in FIG. 2B, an irregular change in composition is performed. Specifically, in portions other than portions in the vicinities of the interfaces between the target objects, gradual changes in the composition of the stripping solution are performed because stripping is allowed to proceed with the stripping solution having a composition appropriate for each of the target objects. In the portions in the vicinities of the interfaces, sharp changes in composition are performed so as not to cause damage to a layer containing another target object or the underlying material.

Second Embodiment

An example of a second embodiment of the present invention is a method in which the stripping solution having the first composition is used, the stripping solution containing both of hydroxylamine and the amino alcohol from the beginning. As described above, the deposited film may also be removed in the presence of hydroxylamine and the amino alcohol. Thus, even though the deposited film is removed with the stripping solution having the first composition, no actual damage is caused. It is possible to reduce the risk of initiating the removal of the transformed layer prior to the preparation of the stripping solution having the second composition that satisfies an amino alcohol content of 7.5% by mass or more.

In this embodiment, for example, the stripping solution having the first composition is used, the stripping solution having an initial concentration of hydroxylamine of 5% by mass or more and an initial concentration of the amino alcohol of 7.5% by mass or more. The deposited film is removed while the amino alcohol is continuously added to the stripping solution to continuously change the composition of the stripping solution. The amino alcohol is further added to the stripping solution to continuously change the composition of the stripping solution from the second composition to the third composition, thereby sequentially removing the transformed layer and the resist.

Figure 4:
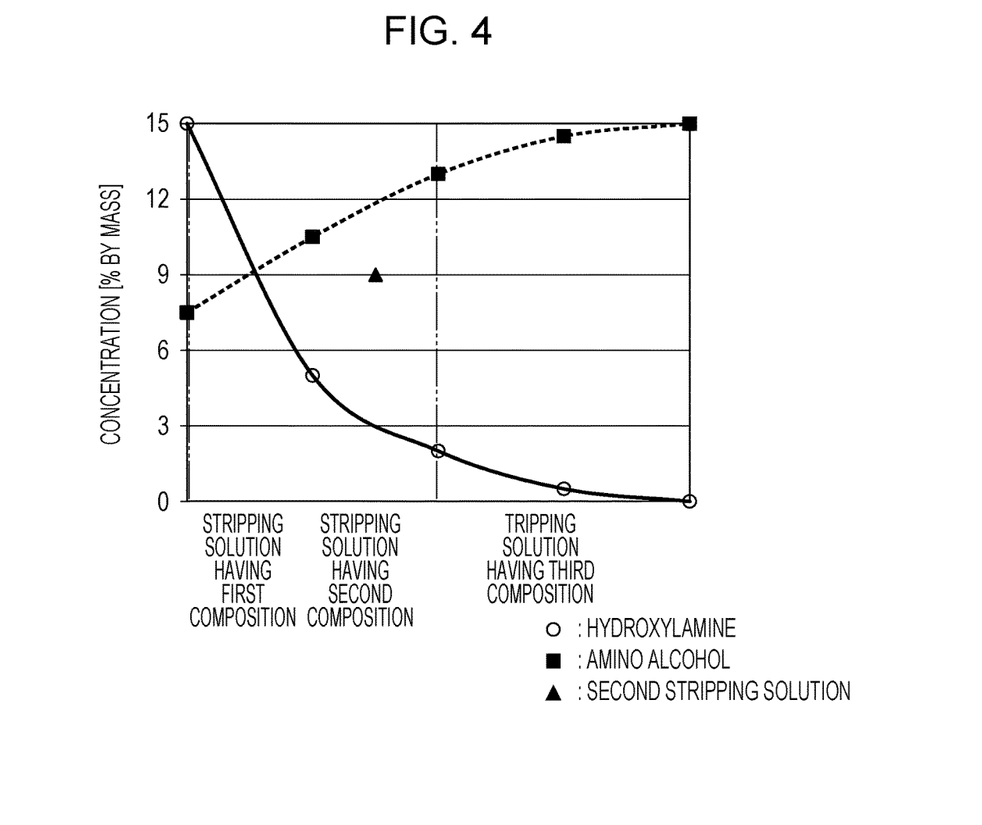
FIG. 4 is a graph depicting an example of a change in the concentration of a stripping solution according to a second embodiment of the present invention.

As an example of this embodiment, FIG. 4 illustrates a change in the composition of the stripping solution having the first composition, the stripping solution having an initial concentration of hydroxylamine of 15% by mass and an initial concentration of the amino alcohol of 7.5% by mass. FIG. 4 illustrates an example of the change in the composition of the stripping solution. For example, as indicated by a solid triangle in FIG. 4, the stripping solution having the second composition may be prepared so as to have a hydroxylamine concentration of 9% by mass and an amino alcohol concentration of 9% by mass. This embodiment also includes the case where the composition of the stripping solution having the first composition is matched to the composition of the stripping solution having the second composition. Similarly to the foregoing description, the amino alcohol may be added at a constant feed rate. Alternatively, the amino alcohol may be added while the feed rate is appropriately adjusted.

EXAMPLES

Example 1

In Example 1, a liquid ejection head was produced by the removal method described in the first embodiment. FIGS. 5A to 5E illustrate steps in a production method.

The 625-μm-thick substrate 6 composed of silicon was prepared, the substrate 6 having a first surface on which an interlayer insulating film 18 and a liquid ejection energy production element 11 were formed. The interlayer insulating film 18 is a layer to electrically insulate the substrate 6 from wiring lines connected to the liquid ejection energy production element 11. A polyether amide-based resin 12 (trade name: HIMAL, manufactured by Hitachi Chemical Co., Ltd.) was applied to the surface (first surface) of the substrate 6 on which the liquid ejection energy production element 11 had been formed. A photosensitive positive-type resist (trade name: iP5700, manufactured by Tokyo Ohka Kogyo Co., Ltd.) was applied to a surface of the polyether amide-based resin 12. Exposure and development were performed with a semiconductor exposure apparatus (trade name: FPA-3000i5, manufactured by CANON KABUSHIKI KAISHA). The polyether amide-based resin 12 was etched with dry etching equipment (CDE80N, manufactured by Shibaura Mechatronics Corporation) using a gas mixture of $O_2$ and $CF_4$ to remove the remaining positive-type resist (FIG. 5A).

A photosensitive chemically-amplified positive-type resist 15 (TZNR (registered trademark), manufactured by Tokyo Ohka Kogyo Co., Ltd.) was applied to a surface (second surface) of the substrate 6 opposite to the first surface so as to have a thickness of 15 μm. Exposure and development were performed with deep-UV exposure equipment (trade name: UX-4258, manufactured by Ushio Inc). Dry etching of silicon was performed with silicon dry etching equipment (trade name: Pegasus, manufactured by SPP Technologies Co., Ltd.) usable for the Bosch process, in which $SF_6$ and $C_4F$ were alternately used. The average in-plane etch depth was 450 μm. The resulting pattern served as a common liquid chamber 16. In this dry etching step, a transformed layer 14 and a deposited film 13 containing a fluorocarbon-based polymer were formed by plasma treatment on a surface of the resist 15 (FIG. 5B).

A single-wafer polymer film removal system (trade name: TWPm8000, manufactured by Takada Corporation) was used as a removal system. Steps of removing the deposited film 13, the transformed layer 14, and the resist 15 were performed. EKC (registered trademark) 265 (hydroxylamine concentration: 17.5% by mass, manufactured by EKC Technology (hereinafter, referred to as "EKC265")) was used as a stripping solution having a first composition and ejected from an ejection nozzle to charge 100 cc of the stripping solution having the first composition into a cup in a chamber. Table 2 lists the composition of EKC265.

The substrate 6 was placed in the chamber. A stripping process was initiated with the substrate 6 spinning at 50 rpm. A stripping solution having an aminoethanol concentration of 15% by mass (trade name: MICROPOSIT REMOVER 1112A, manufactured by Rohm and Haas Electronic Materials, hereinafter referred to as "1112A") was continuously added dropwise from the ejection nozzle to the stripping solution having the first composition in the cup to start to change the composition of the stripping solution from the first composition to a second composition. Table 3 lists the composition of 1112A.

Then, 200 cc of 1112A was added dropwise from the ejection nozzle to the stripping solution in the cup over a period of 200 seconds to change the composition of the stripping solution. The proportion of 1112A was gradually increased in such a manner that the hydroxylamine concentration was 5.8% by mass and the aminoethanol concentration was 10% by mass. These concentrations of hydroxylamine and aminoethanol correspond to the initial concentrations thereof in the stripping solution having the second composition. This step is a step of mainly removing the deposited film 13. Needless to say, the removal of the transformed layer 14 may have already started in some portions because of the in-plane distribution.

Next, 150 cc of 1112A was added dropwise from the ejection nozzle to the cup while 150 cc of the stripping solution mixture in the cup was drained from the drainage nozzle over a period of 150 seconds. The proportion of 1112A was increased in such a manner that the hydroxylamine concentration was 2.9% by mass and the aminoethanol concentration was 12.5% by mass. These concentrations of hydroxylamine and aminoethanol correspond to the initial concentrations thereof in the stripping solution having a third composition. This step is a step of mainly removing the transformed layer 14. Needless to say, the removal of the resist 15 may have already started in some portions because of the in-plane distribution.

Then, 250 cc of 1112A was added dropwise from the ejection nozzle to the cup while 250 cc of the stripping solution mixture in the cup was drained from the drainage nozzle over a period of 250 seconds. The proportion of 1112A was increased in such a manner that the hydroxylamine concentration was 0.49% by mass and the aminoethanol concentration was 14.6% by mass prior to the exposure of an underlying material. This step is a step of mainly removing the resist 15.

Figure 5C:
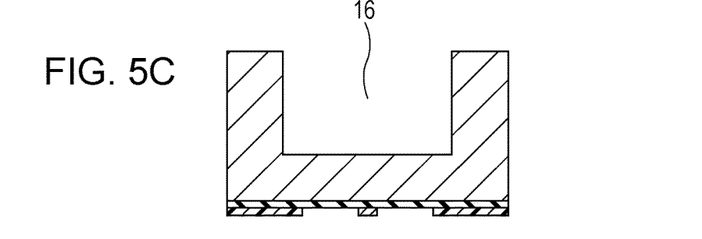
Figure 6:
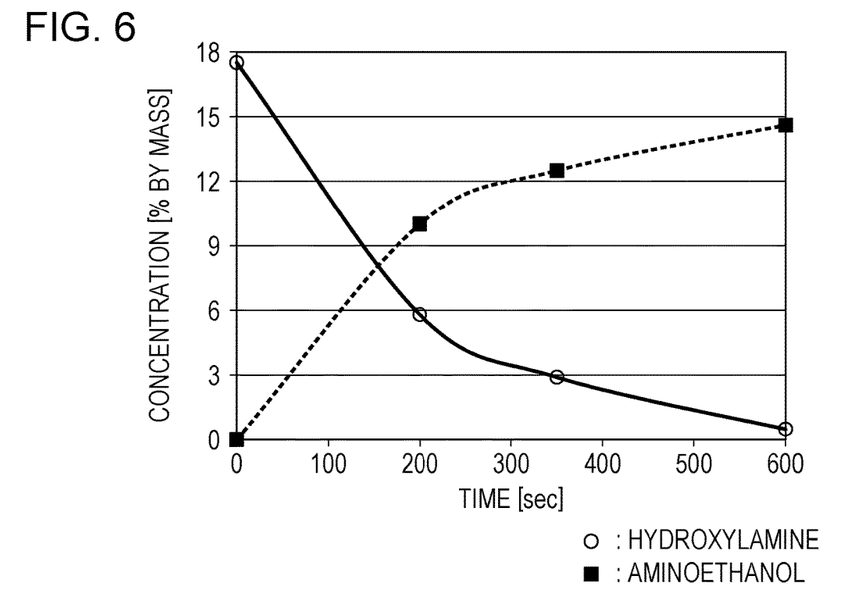
FIG. 6 is a graph depicting a change in the concentration of a stripping solution according to Example 1 of the present invention.

All the deposited film 13, the transformed layer 14, and the resist 15 on the second surface of the substrate 6 were removed by the foregoing removal steps without producing stripping residues (FIG. 5C). In the removal steps, the temperature of the stripping solution was adjusted to 50° C., and then the stripping process was performed. FIG. 6 is a time-series graph depicting changes in concentrations of hydroxylamine and aminoethanol in the stripping solution in the foregoing removal steps.

Figure 5D:
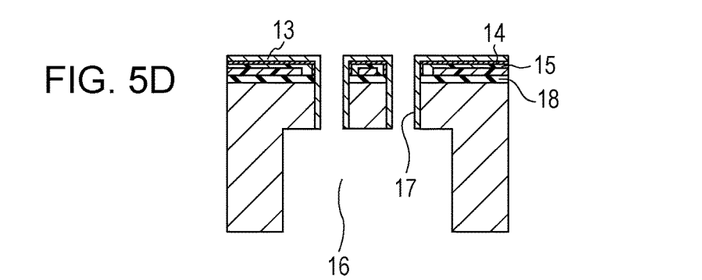

The photosensitive chemically-amplified positive-type resist 15 (TZNR (registered trademark), manufactured by Tokyo Ohka Kogyo Co., Ltd.) was applied to the first surface of the substrate 6 so as to have a thickness of 15 μm. Exposure and development were performed with a semiconductor exposure apparatus (trade name: FPA-3000i5, manufactured by CANON KABUSHIKI KAISHA). The interlayer insulating film 18 for a wiring layer on the first surface was subjected to dry etching with etching equipment (trade name: APS, manufactured by SPP Technologies Co., Ltd.) using a gas mixture of $C_4F_8$, $CF_4$, and Ar. Dry etching of silicon was then performed by the Bosch process in which $SF_6$ and $C_4F_9$ were alternately used with silicon dry etching equipment (trade name: Pegasus, manufactured by SPP Technologies Co., Ltd). A pattern formed by the etching served as ink supply ports 17. The ink supply ports 17 were formed so as to communicate with the common liquid chamber 16. In this dry etching step, the transformed layer 14 and the deposited film 13 containing a fluorocarbon-based polymer were formed by plasma treatment on a surface of the resist 15 (FIG. 5D). The deposited film 13, the transformed layer 14, and the resist 15 were sequentially removed by the same stripping process as for the second surface of the substrate 6. All of the deposited film 13, the transformed layer 14, and the resist 15 on the first surface of the substrate 6 were selectively removed by the removal steps without producing stripping residues or causing damage to the underlying material.

Figure 5E:
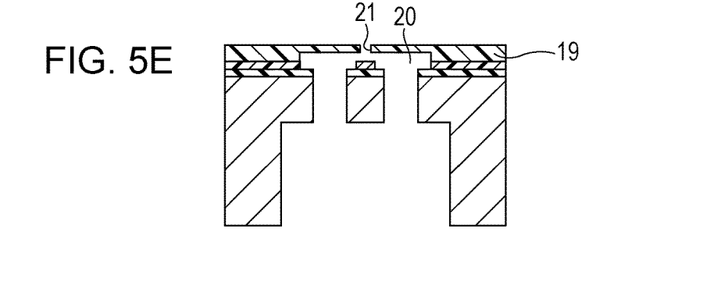

A 20-μm-thick film 19 composed of a photosensitive resin (TMMF (registered trademark), manufactured by Tokyo Ohka Kogyo Co., Ltd.) was bonded to the first surface of the substrate 6 with a film resist lamination machine (trade name: VTM-200M, manufactured by Takatori Corporation) so as to cover the common liquid chamber 16. Exposure and development were performed with deep-UV exposure equipment (trade name: UX-4258, manufactured by Ushio Inc) to form a liquid flow passage 20 and an ejection orifice 21 (FIG. 5E). Heat treatment was performed in an oven at 200° C. for 60 minutes to completely cure the film 19. A liquid ejection head was completed by the foregoing steps.

Example 2

In Example 2, a liquid ejection head was produced by the production process described in the second embodiment. The basic steps of the production process in Example 2 were the same as in Example 1, except that changes in concentrations of the stripping solution used in the removal steps were different from those in Example 1.

In the steps of removing the deposited film 13, the transformed layer 14, and the resist 15 after the formation of the common liquid chamber 16 by etching the second surface of the substrate 6, a single-wafer polymer film removal system (trade name: TWPm8000, manufactured by Takada Corporation) was used as a removal system. First, 100 cc of EKC265 (trade name) having a hydroxylamine concentration of 17.5% by mass and 150 cc of 1112A (trade name) having an aminoethanol concentration of 15% by mass were mixed together to prepare a stripping solution having a first composition, the stripping solution having an initial concentration of hydroxylamine of 7% by mass and an initial concentration of aminoethanol of 9% by mass. The stripping solution having the first composition was ejected from an ejection nozzle into a cup to completely immerse the substrate 6.

Next, 100 cc of 1112A was added dropwise while 100 cc of the stripping solution having the first composition in the cup was drained over a period of 100 seconds. The proportion of 1112A was gradually increased in such a manner that the hydroxylamine concentration was 4.2% by mass and the aminoethanol concentration was 11.4% by mass. These concentrations of hydroxylamine and aminoethanol correspond to the initial concentrations thereof in the stripping solution having a second composition. This step is a step of mainly removing the deposited film 13. Needless to say, the removal of the transformed layer 14 may have already started in some portions because of the in-plane distribution.

Subsequently, 150 cc of 1112A was added dropwise while 150 cc of the stripping solution mixture in the cup was drained over a period of 150 seconds. The proportion of 1112A was increased in such a manner that the hydroxylamine concentration was 2.8% by mass and the aminoethanol concentration was 12.6% by mass. These concentrations of hydroxylamine and aminoethanol correspond to the initial concentrations thereof in the stripping solution having a third composition. This step is a step of mainly removing the transformed layer 14. Needless to say, the removal of the resist 15 may have already started in some portions because of the in-plane distribution.

Then, 210 cc of 1112A was added dropwise while 210 cc of the stripping solution mixture in the cup was drained over a period of 210 seconds. The proportion of 1112A was increased in such a manner that the hydroxylamine concentration was 0.45% by mass and the aminoethanol concentration was 14.6% by mass prior to the exposure of an underlying material. This step is a step of mainly removing the resist 15.

Figure 7:
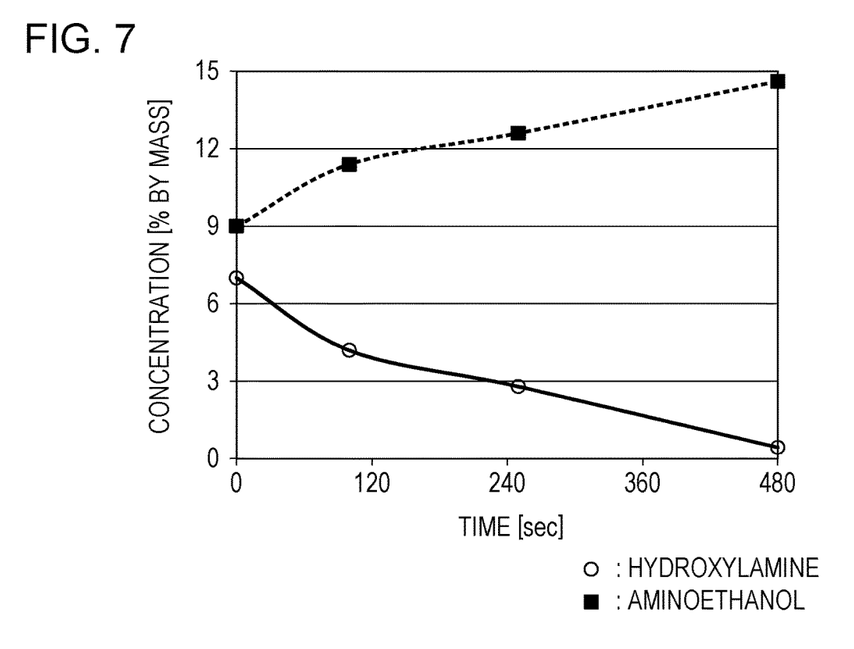
FIG. 7 is a graph depicting a change in the concentration of a stripping solution according to Example 2 of the present invention.

All the deposited film 13, the transformed layer 14, and the resist 15 were removed by the foregoing removal steps without producing stripping residues. In the removal steps, the temperature of the stripping solution was adjusted to 50° C., and then the stripping process was performed. FIG. 7 is a time-series graph depicting changes in concentrations of hydroxylamine and aminoethanol in the stripping solution in the foregoing removal steps.

The subsequent steps were performed as in Example 1, except that in the removal steps of removing the deposited film 13, the transformed layer 14, and the resist 15 on the first surface of the substrate 6, a stripping solution having the same composition as that of the stripping solution used in the removal steps performed on the second surface was used. Thereby, a liquid ejection head was completed. In the removal steps performed on the first surface of the substrate 6, all of the deposited film 13, the transformed layer 14, and the resist 15 were selectively removed without producing stripping residues or causing damage to the underlying material.

Comparative Example 1

In Comparative example 1, in the removal steps, a method for continuously changing the composition of a stripping solution from a first composition to a second composition and then from the second composition to a third composition was not employed. The substrate 6 was sequentially immersed in a stripping solution having a first composition, a stripping solution having a second composition, and a stripping solution having a third composition prepared in advance, thereby removing the deposited film 13, the transformed layer 14, and the resist 15. The remaining steps are the same as in Example 1.

As the stripping solution having the first composition, EKC265 having a hydroxylamine concentration of 17.5% by mass was used. As the stripping solution having the second composition, a stripping solution having a hydroxylamine concentration of 9% by mass and an aminoethanol concentration of 7.5% by mass was used, the stripping solution being prepared by mixing EKC265 and 1112A together. As the stripping solution having the third composition, 1112A having an aminoethanol concentration of 15% by mass was used. The processing time and the temperature of the stripping solutions in the stripping process were equal to those in Example 1. After the process with the stripping solution having the first composition was performed, the resist on the surface of the substrate 6 was transformed by the stripping solution over a wide range, thus causing difficulty in removing the target objects. The results demonstrated that when the stripping solution having the first composition, the stripping solution having the second composition, and the stripping solution having the third composition were used to remove the target objects, the continuous change in the composition of the stripping solution was required.

Comparative Example 2

In Comparative example 2, a stripping solution capable of removing all three types of target objects was used for a stripping process without changing the composition, the stripping solution having a hydroxylamine concentration of 7% by mass and an aminoethanol concentration of 9% by mass. The processing time and the temperature of the stripping solution were equal to those in Example 2. Although the target objects were removed, a 300-nm-thick portion of the polyether amide-based resin 12 present as an underlying material was dissolved. The results demonstrated that in order not to cause damage to the underlying material, the continuous change in the composition of the stripping solution was required.

TABLE 1

| Trade name | Component name | Content (% by mass) |
|---|---|---|
| TXNR-E1050 PM (manufactured by Tokyo Ohka Kogyo Co., Ltd.) | propylene glycol monomethyl ether acetate | 55 to 65 |
| | novolac resin | 35 to 45 |
| | 2-[2-(propylsulfonyloxy-imino)thiophene-3(2H)-ylidene]-2-(2-methylphenyl)acetonitrile | <1 |
| THMR-iP5700 HP (manufactured by Tokyo Ohka Kogyo Co., Ltd.) | 2-heptanone | 40 to 95 |
| | 1,4-dioxane | <1 |
| | novolac resin | 5 to 45 |
| | photosensitive agent | 1 to 15 |
| | perfluoroalkyl group-containing oligomer | <1 |
| AZ P4620 (manufactured by AZ Electronic Materials) | propylene glycol monomethyl ether acetate | 60 |
| | novolac resin derivative | not disclosed |
| | naphthoquinone diazide derivative | not disclosed |
| MEGAPOSIT SPR 220-7.0 POSITIVE PHOTORESIST (manufactured by Rohm and Haas Electronic Materials) | cresol novolac resin | 25 to 35 |
| | ethyl lactate | 25 to 35 |
| | anisole | 10 to 20 |
| | diazo-based photosensitive agent | 1 to 10 |
| | 2-methylbutyl acetate | 1 to 10 |
| | pentyl acetate | 1 to 10 |
| | cresol (isomeric mixture) | 0.99 |
| | organic silicon-based activator | 0.99 |
| | 1,4-dioxane | <1 |

TABLE 2

EKC265

| Component name | Content (% by mass) |
|---|---|
| Hydroxylamine | 17.5 |
| Substituted amine | 55 to 65 |
| Pyrocatechol | 5 |
| Water | <30 |

TABLE 3

MICROPOSIT REMOVER 1112A

| Component name | Content (% by mass) |
|---|---|
| 2-(2-Butoxyethoxy)ethanol | 20 to 30 |
| Ethylene glycol n-butyl ether | 20 to 30 |
| 1-(2-Methoxy-2-methylethoxy)-2-propanol | 10 to 20 |
| 2-Aminoethanol | 10 to 20 |

TABLE 3-continued

MICROPOSIT REMOVER 1112A

| Component name | Content (% by mass) |
|---|---|
| Water | 5 to 15 |
| Furfuryl alcohol | 1 to 10 |
| Polyether | 1 to 10 |

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-178591 filed Sep. 10, 2015, which is hereby incorporated by reference herein in its entirety.

What is claimed is:

1. A method for removing a target object with a stripping solution, the target object including a mask material, a transformed layer, and a deposited film, the mask material being formed on a substrate by using a resist, the transformed layer being formed on a surface of the mask material in a step of forming a pattern on the substrate by dry etching with the mask material, the deposited film being formed on a surface of the substrate and a surface of the transformed layer, and the stripping solution including:
a first composition capable of removing the deposited film,
a second composition capable of removing the transformed layer, and
a third composition capable of removing the mask material, the method comprising:
a removal step including:
a substep of removing the deposited film with the stripping solution having the first composition,
a substep of continuously changing the composition of the stripping solution from the first composition to the second composition at least prior to the exposure of the transformed layer,
a substep of removing the transformed layer with the stripping solution having the second composition,
a substep of continuously changing the composition of the stripping solution from the second composition to the third composition with at least the mask material remaining, and
a substep of removing the mask material with the stripping solution having the third composition, wherein the stripping solution contains at least one of hydroxylamine and an amino alcohol,
wherein the concentration of hydroxylamine in the stripping solution is not changed or is reduced as the removal step proceeds, and
wherein the concentration of the amino alcohol in the stripping solution is not changed or is increased as the removal step proceeds.

2. The method according to claim 1,
wherein in the removal step, changes in the composition of the stripping solution from the first composition to the second composition and from the second composition to the third composition are performed by the addition of the amino alcohol, and
wherein as the removal step proceeds, the concentration of hydroxylamine in the stripping solution is reduced, and the concentration of the amino alcohol in the stripping solution is increased.

3. The method according to claim 1,
wherein the stripping solution having the first composition has an initial concentration of hydroxylamine of 2.5% by mass or more, and
the stripping solution having the third composition has an initial concentration of the amino alcohol of 10% by mass or more.

4. The method according to claim 3,
wherein the stripping solution having the first composition has an initial concentration of the amino alcohol less than 7.5% by mass.

5. The method according to claim 3,
wherein the stripping solution having the first composition has an initial concentration of hydroxylamine of 5% by mass or more and an initial concentration of the amino alcohol of 7.5% by mass or more.

6. The method according to claim 1,
wherein the stripping solution having the second composition has an initial concentration of hydroxylamine of 2.5% by mass or more and an initial concentration of the amino alcohol of 7.5% by mass or more.

7. The method according to claim 1,
wherein the composition of the stripping solution having the third composition is changed in such a manner that the stripping solution has a hydroxylamine concentration less than 0.5% by mass and an amino alcohol concentration of 10% by mass or more prior to the exposure of a surface of an underlying material containing an organic material other than the target object, the underlying material being arranged on an upper surface of the substrate and a lower surface of the mask material.

8. The method according to claim 1,
wherein the stripping solution having the first composition, the stripping solution having the second composition, and the stripping solution having the third composition are adjusted to a temperature of 35° C. or higher, and then the removal step is performed.

9. The method according to claim 1,
wherein the amino alcohol is aminoethanol.

10. The method according to claim 1,
wherein the mask material is a resist comprising at least one resin selected from the group consisting of novolac-based resins, styrene-based resins, and acrylic-based resins.

11. The method according to claim 1,
wherein the removal step is performed with a single wafer processing apparatus.

12. A process for producing a liquid ejection head, comprising:
a method for removing a target object with a stripping solution, the target object including a mask material, a transformed layer, and a deposited film, the mask material being formed on a substrate by using a resist, the transformed layer being formed on a surface of the mask material in a step of forming a pattern on the substrate by dry etching with the mask material, the deposited film being formed on a surface of the substrate and a surface of the transformed layer, and the stripping solution including:
a first composition capable of removing the deposited film, a second composition capable of removing the transformed layer, and
a third composition capable of removing the mask material,
the method including:
a removal step that includes:
   a substep of removing the deposited film with the stripping solution having the first composition,
   a substep of continuously changing the composition of the stripping solution from the first composition to the second composition at least prior to the exposure of the transformed layer,
   a substep of removing the transformed layer with the stripping solution having the second composition,
   a substep of continuously changing the composition of the stripping solution from the second composition to the third composition with at least the mask material remaining, and
   a substep of removing the mask material with the stripping solution having the third composition,
wherein the stripping solution contains at least one of hydroxylamine and an amino alcohol,
wherein the concentration of hydroxylamine in the stripping solution is not changed or is reduced as the removal step proceeds, and
wherein the concentration of the amino alcohol in the stripping solution is not changed or is increased as the removal step proceeds.

13. The process according to claim 12,
wherein in the removal step, changes in the composition of the stripping solution from the first composition to the second composition and from the second composition to the third composition are performed by the addition of the amino alcohol, and
wherein as the removal step proceeds, the concentration of hydroxylamine in the stripping solution is reduced, and the concentration of the amino alcohol in the stripping solution is increased.

14. The process according to claim 12,
wherein the stripping solution having the first composition has an initial concentration of hydroxylamine of 2.5% by mass or more, and
the stripping solution having the third composition has an initial concentration of the amino alcohol of 10% by mass or more.

15. The process according to claim 14,
wherein the stripping solution having the first composition has an initial concentration of the amino alcohol less than 7.5% by mass.

16. The process according to claim 14,
wherein the stripping solution having the first composition has an initial concentration of hydroxylamine of 5% by mass or more and an initial concentration of the amino alcohol of 7.5% by mass or more.

17. The process according to claim 12,
wherein the stripping solution having the second composition has an initial concentration of hydroxylamine of 2.5% by mass or more and an initial concentration of the amino alcohol of 7.5% by mass or more.

18. The process according to claim 12,
wherein the composition of the stripping solution having the third composition is changed in such a manner that the stripping solution has a hydroxylamine concentration less than 0.5% by mass and an amino alcohol concentration of 10% by mass or more prior to the exposure of a surface of an underlying material containing an organic material other than the target object, the underlying material being arranged on an upper surface of the substrate and a lower surface of the mask material.

19. The process according to claim 12,
wherein the stripping solution having the first composition, the stripping solution having the second composition, and the stripping solution having the third composition are adjusted to a temperature of 35° C. or higher, and then the removal step is performed.

20. The process according to claim 12,
wherein the amino alcohol is aminoethanol.

* * * * *